United States Patent [19]

Nakanishi et al.

[11] Patent Number: 5,837,425
[45] Date of Patent: Nov. 17, 1998

[54] METHOD OF PREPARING A LITHOGRAPHIC PRINTING PLATE USING A DEVELOPER CONTAINING A DEVELOPMENT STABILIZER

[75] Inventors: Haruo Nakanishi; Tadao Toyama; Hiroshi Matsumoto, all of Shizuoka, Japan

[73] Assignee: Fuji Photo Film Co., Ltd., Ashigara, Japan

[21] Appl. No.: 974,228

[22] Filed: Nov. 19, 1997

Related U.S. Application Data

[62] Division of Ser. No. 567,275, Dec. 5, 1995, abandoned.

[30] Foreign Application Priority Data

Dec. 6, 1994 [JP] Japan .................................. 6-302325
Feb. 23, 1995 [JP] Japan .................................. 7-035492

[51] Int. Cl.⁶ ...................................................... G03F 7/00
[52] U.S. Cl. ........................................ 430/302; 430/331
[58] Field of Search ...................................... 430/302, 331

[56] References Cited

U.S. PATENT DOCUMENTS 4,569,904 2/1986 Okutsu et al. ........................... 430/434
4,711,836 12/1987 Ferreira ................................... 430/331

FOREIGN PATENT DOCUMENTS 0076984 10/1982 European Pat. Off. .
3008824 9/1980 Germany .
58-214145 12/1983 Japan .
5-94024 4/1993 Japan .
WO81/03231 11/1981 WIPO .

OTHER PUBLICATIONS

Grant & Hackh's Chemical Dictionary; p. 439, 1987.
Database WPI, Week 9320, Derwent Publications, Ltd., London, GB; AN 93–162576 & JP–A–05 094 024 (Mitsubishi Gas Chem Co) *Abstract*.
Database WPI, Week 8404, Derwent Publications, Ltd., London, GB; AB 84–021652 & JP–A–58 214 145 (Toyoba) *Abstract*.

*Primary Examiner*—M. Nuzzolillo
*Assistant Examiner*—Laura Weiner
*Attorney, Agent, or Firm*—Burns, Doane, Swecker & Mathis, LLP

[57] ABSTRACT

Provided are a developer suitable for both positive working and negative working photosensitive lithographic printing plates for lithography and a replenisher thereof which comprise as a development stabilizer at least one compound selected from the group consisting of sugars, oximes, phenols and fluorinated alcohols in a proportion of at least 0.01 mole/l and have their pH values in the range of 11.0 to 13.5 by containing an alkali agent and a developer for photosensitive lithographic printing plates which comprises (1) a compound represented by formula (A) or (B) described in the present specification, (2) at least one compound selected from the group consisting of phenols, sugars, oximes and fluorinated alcohols which have buffering effect in the pH range of 11.5 to 13.5 and (3) a specific alkali agent, and has a pH of 11.5 to 13.5.

6 Claims, No Drawings

METHOD OF PREPARING A LITHOGRAPHIC PRINTING PLATE USING A DEVELOPER CONTAINING A DEVELOPMENT STABILIZER

This application is a divisional, of application Ser. No. 08/567,275, filed Dec. 5, 1995 now abandoned.

FIELD OF THE INVENTION

The present invention relates to a developer for photosensitive lithographic printing plates and a replenisher thereof.

BACKGROUND OF THE INVENTION

The positive working presensitized plate which has hitherto prevailed is a lithographic printing plate having on an aluminum plate as a support a photosensitive layer comprising an o-quinonediazide compound. An o-quinonediazide compound is known to be converted into a carboxylic acid by exposure to ultraviolet rays, and so the development of such a photosensitive layer with an alkaline aqueous solution can leave the support surface bare in the exposed areas alone. Since the surface of an aluminum support is hydrophilic, the areas of the support surface left bare by the development (non-image areas) can hold water and repel oily ink. On the other hand, the areas of the support surface on which the photosensitive layer remains without being removed by the development (image areas) are lipophilic, and so they can repel water and receive ink. As a developer suitable for such a positive working photosensitive lithographic printing plate, though various alkaline aqueous solutions are known, the most preferred ones are aqueous solutions of silicates, such as sodium silicate, potassium silicate and the like. This is because the developability can be controlled to some extent by changing the proportions of components of an silicate, namely silicon oxide ($SiO_2$) and an alkali metal oxide ($M_2O$), (in other words, the $Si_2O/M_2O$ ratio by mole) and the concentrations of both components in the solution.

In the field of platemaking and graphic arts, automatic processors for photosensitive lithographic printing plates have been widely used in recent years with the intention of rationalizing and standardizing the platemaking operations.

With respect to the development of positive working photosensitive lithographic printing plates with an automatic processor, JP-A-54-62004 (the term "JP-A" as used herein means an "unexamined published Japanese patent application") discloses the following: The processing of a great deal of photosensitive lithographic printing plates without renewing a developer in a tank for a long time becomes possible by using as the developer an aqueous solution of sodium silicate having a $SiO_2/Na_2O$ ratio ranging from 1.0 to 1.5 by mole and a $SiO_2$ concentration of from 1 to 4% by weight, and continuously or intermittently adding to the developer an aqueous solution of sodium silicate having a $SiO_2/Na_2O$ ratio in the range of 0.5 to 1.5 by mole (replenisher) depending on the quantity of photosensitive lithographic printing plates processed.

In addition, JP-B-57-7427 (the term "JP-B" as used herein means an "examined Japanese patent publication") discloses the developing method which comprises the use of an alkali metal silicate developer having a $SiO_2/M$ ratio in the range of 0.5 to 0.75 and a $SiO_2$ concentration in the range of 1 to 4% by weight, the use of a replenisher containing an alkali metal silicate having a $SiO_2/M$ ratio in the range of 0.25 to 0.75, and the control of the proportion of potassium for the total of alkali metals present in each of the developer and the replenisher to at least 20% on a gram-atom basis.

In the use of the developer containing the aforementioned silicate as a main component, it is known that solid matter derived from $SiO_2$ tends to separate out, the nozzles fitted to an automatic processor are apt to be clogged, and it is not easy to remove the solid stains stuck to the developing machine by water-washing since they are difficult to dissolve in water. Thus, the developer has problems attributable to the lack of solution stability. In addition, it is also known that the enhancement of alkalinity of a developer lowers the development stability although it can heighten the processing capacity. Further, on carrying out a neutralization treatment in order to dispose of waste developer, the developer is subject to gelation due to the presence of $SiO_2$ therein which can provide troubles such that the pipe system becomes clogged.

As a method of imparting development stability to a developer having high alkalinity, JP-A-02-2572 discloses a method of adding carbonate to an aqueous solution of alkali metal silicate as the developer. However, the development stability of the developer prepared by such a method is also insufficient.

Furthermore, there are described the method of adding an anionic surfactant or an amphoteric surfactant to a silicate developer in JP-A-50-51324, the method of adding a water-soluble cationic polymer to a silicate developer in JP-A-55-95946, and the method of adding a water-soluble amphoteric polyelectrolyte to a silicate developer in JP-A-56-142528. However, those developers all foam considerably when they are stirred during the development with an automatic processor, and thereby the developing machine is fouled.

As an additive to be incorporated in a developer and a replenisher thereof for improving the conventional developers described above, Japanese Patent Application No. 5-71589 discloses a water-soluble ethylene oxide adduct obtained by the addition of no less than 5 moles of ethylene oxide to a sugar-alcohol having 4 or more hydroxy groups. However, the developer containing such an additive has a problem in being concentrated, though a developer is generally put on the market in the form of 3- to 10-fold concentrated solution for the convenience of transportation and so on.

On the other hand, those silicate developers can be used for the development of not only the aforementioned positive working photosensitive lithographic printing plates but also negative working photosensitive lithographic printing plates, including the negative working reversal photosensitive lithographic printing plate having an o-quinonediazide photosensitive layer as described in JP-B-56-14970, a negative working photosensitive lithographic printing plate having a photosensitive layer in which an alkali-soluble diazonium salt is used and a negative working photosensitive lithographic printing plate having a photosensitive layer in which a resin containing dimethylmaleimido groups in its side chains is used as a photocrosslinking agent. In recent years, therefore, the processing common to both negative and positive working photosensitive lithographic printing plates has been carried out using one automatic processor with the invention of achieving a saving of space and resources. However, such processing has a problem in that if the alkalinity of a developer to be used therein is increased in order to achieve high capacity for processing positive working photosensitive lithographic printing plates, the developer suffers a considerable reduction of the ability to develop negative working photosensitive lithographic printing plates so as to result in failure of common processing.

SUMMARY OF THE INVENTION

An object of the present invention is to provide a developer for a photosensitive lithographic printing plate and a replenisher for the developer which have a high processing capacity and solution stability suitable for an automatic processor.

Another object of the present invention is to provide a developer for a photosensitive lithographic printing plate and a replenisher for the developer which have high storage stability in the form of a concentrated solution.

A further object of the present invention is to provide a developer and a replenisher for the developer which are suitable for processing both negative and positive working photosensitive lithographic printing plates.

As a result of our intensive studies, the above-described objects were achieved by a developer for a photosensitive lithographic printing plate and a replenisher for the developer containing as a development stabilizer at least one compound selected from the group consisting of sugars, oximes, phenols and fluorinated alcohols in a proportion of at least 0.01 mole/l and having a pH value adjusted to the range of 11.0 to 13.5 with an alkali agent.

The developer has not only excellent consistency in developability but also generates no solid matter when used in an automatic processor.

More specifically, our intensive studies to achieve the foregoing objects have result in the discovery that the aforementioned problems can be solved by:

adding to a developer and/or its replenisher (collectively called a developer) for photosensitive lithographic printing plates (sometimes referred to as presensitized plates (PS plates))

(1) a compound represented by the following formula (A) or (B), (2) at least one compound selected from the group consisting of phenols, sugars, oximes and fluorinated alcohols which have buffering effect in the pH range 11.5–13.5, and (3) at least one alkali agent selected from the group consisting of sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, ammonium hydroxide, potassium hydroxide, lithium hydroxide, monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine, tetramethylammonium hydroxide, tetraethylammonium hydroxide, tetrapropylammonium hydroxide and tetrabutylammonium hydroxide;

and adjusting the pH of the developer to the range of 11.5 to 13.5:

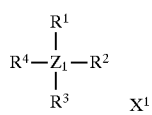

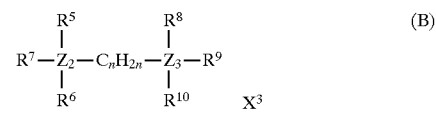

wherein $R^1$ to $R^{10}$ each independently represents an alkyl group having 1 to 12 carbon atoms, a cycloalkyl group, a hydroxyalkyl group, an unsubstituted or alkyl-substituted benzyl group, or a substituted or unsubstituted phenyl group; $Z_1$ to $Z_3$ each independently represents $N^+$, $P^+$ or $B^-$; when $Z_1$ to $Z_3$ are $N^+$ or $P^+$, $X^1$ to $X^3$ represent an anion, and when $Z_1$ to $Z_3$ are $B^-$, they represent a cation; and n is an integer of from 1 to 5.

DETAILED DESCRIPTION OF THE INVENTION

The development stabilizer used in the present invention is preferably a compound having an acid dissociation constant in the range of $5 \times 10^{-14}$ to $1 \times 10^{-11}$. When such a compound is present in a developer in the amount of at least 0.01 mole/l, particularly from 0.03 to 3 mole/l, the sensitivity of PS plates to be developed can be obtained stably. Additionally, the term "acid dissociation constant" as used herein is intended to include those of first order, second order, third order and so forth. In other words, the compound can be used as the development stabilizer as far as in its acid dissociation of any order it has a dissociation constant in the range of $5 \times 10^{-14}$ to $1 \times 10^{-11}$. This is because the power of maintaining the pH stable is enhanced when the acid dissociation constant is in the above-defined range. The addition of such a compound in an amount less than 0.01 mole/l is undesirable because it cannot produce sufficient development stabilizing effect; while the compound added in an amount greater than 3 mole/l sometimes deteriorates the dissolution properties of a photosensitive layer.

The compounds which can be preferably used as the present development stabilizer are sugars (especially those represented by the following formula (I) or (II)), oximes (especially those represented by the following formula (III)), phenols (especially those represented by the following formula (IV)) and fluorinated alcohols (especially those represented by the following formula (V)).

The sugars represented by formula (I) or (II) are the following:

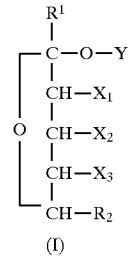

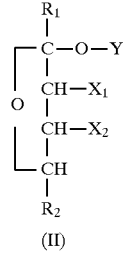

wherein $X_1$, $X_2$ and $X_3$ each independently represents a hydrogen atom, a hydroxy group, an amino group, a halogen atom, an acyloxy group, an alkoxy group, an acylamino group or a phosphoryloxy group; $R_1$ and $R_2$ each independently represents a hydrogen atom, an alkyl group (e.g., methyl), a substituted alkyl group (e.g., hydroxymethyl, 1,2-dihydroxyethyl, acetoxymethyl, benzoyloxymethyl, methoxymethyl, benzyloxymethyl) or a carboxyl group; Y represents a hydrogen atom, an acyl group, an alkoxycarbonyl group, a carbamoyl group or an alkyl group; and wherein when the substituents represented by $X_1$, $X_2$, $X_3$, $R_1$, $R_2$ and Y are hydroxy groups or hydroxy-containing groups, any two of the hydroxy groups may be combined with each other by an ether linkage or further through acetylation by the addition of a carbonyl compound such as acetone, benzaldehyde or the like to form a 5- or 6-membered ring.

An oligosaccharide containing n units of formula (I) or (II) may be formed by combining Y in a compound represented by formula (I) or (II) with a hydroxy group represented by $X_1$, $X_2$, $X_3$, $R_1$, $R_2$ or Y in another compound represented by formula (I) or (II) to form a glucoxide linkage and repeating this linkage procedure (n−1) times. Therein, n is an integer from 2 to 6.

$X_1$, $X_2$ and $X_3$ each is preferably a hydrogen atom or a hydroxy group, and more preferably a hydroxy group.

$R_1$ and $R_2$ each is preferably a hydrogen atom, a hydroxymethyl group, a 1,2-dihydroxyethyl group or a carboxyl group, and more preferably a hydrogen atom, a hydroxymethyl group or a 1,2-dihydroxyethyl group.

Y is preferably a hydrogen atom.

Examples of sugars represented by formula (I) or (II) include:

I-1 D-Erythrose*
I-2 D-Threose*
I-3 D--Arabinose
I-4 D--Ribose
I-5 D-Xylose
I-6 D-Erythro-Pentulose*
I-7 D-Allose
I-8 D-Galactose
I-9 D-Glucose
I-10 D-Mannose
I-11 D-Talose
I-12 β-D-Fructose
I-13 α-L-Sorbose
I-14 6-Deoxy-D-glucose
I-15 D-Glycero-D-galacto-heptose
I-16 α-D-Allo-heptulose
I-17 β-D-Altro-3-heptulose
I-18 Sucrose
I-19 Lactose
I-20 D-Maltose
I-21 Isomaltose
I-22 Inulobiose*
I-23 Hyalbiouronic acid
I-24 Maltotriose
I-25

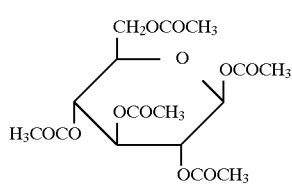

I-26 (*)

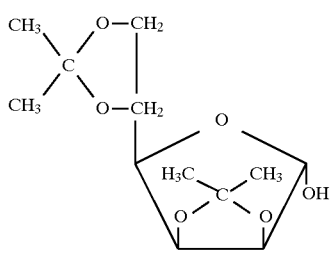

The compounds to which the mark * is attached are those represented by formula (II).

Most of the compounds as cited above are commercially available. Even if such compounds are not on the market, they can be produced with ease by reference to the books, e.g., (1) *Dai-Yukikagaku Dai 3-Kan, Shibozoku Kagobutsu II (Great Organic Chemistry vol. 3, Aliphatic Compounds II)*, published in 1957 by Asakura Shoten under the supervision of Munio Kotake, and (2) *The Carbohydrates, Chemistry and Biochemistry,* 2nd Ed. IA (1972) and IIA (1970), published from Academic Press under the supervision of W. Pibgman and D. Horton.

The oximes represented by formula (III) are the following:

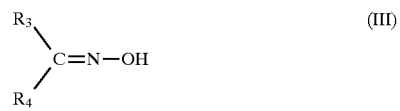

wherein $R_3$ and $R_4$ each independently represents a hydrogen atom, an alkyl group (which may have a substituent), an aryl group (which may have a substituent), an acyl group, or a heterocyclic group; or $R_3$ and $R_4$ are combined with each other to complete a 5- or 6-membered ring (especially a cycloalkyl ring).

Examples of the alkyl group represented by $R_3$ or $R_4$ includes a straight-chain, branched and cycloalkyl group containing 1 to 18 carbon atoms. Examples of a substituent which the alkyl group may have include a hydroxy group, a carboxyl group, an alkoxy group, a halogen atom, a sulfo group, a sulfamoyl group, a carbamoyl group, a sulfonylamino group, an acylamino group, a cyano group and an acyloxy group.

Examples of the aryl group represented by $R_3$ or $R_4$ include a phenyl group and a naphthyl group. Examples of a substituent which the aryl group may have include the groups recited above as the substituent which the alkyl group may have.

Examples of the acyl group represented by $R_3$ or $R_4$ include a formyl group, an acetyl group, a propionyl group, a butyryl group, an oxalyl group, a malonyl group, a benzoyl group, a toluoyl group, a salicyloyl group and a furoyl group.

Examples of the heterocyclic group represented by $R_3$ or $R_4$ include a thiazolyl group, an oxazolyl group, an imidazolyl group, a triazolyl group, a tetrazolyl group, a thiadiazolyl group, an oxadiazolyl group, a tetrahydrofuranyl group, a morpholino group, a pyridyl group, a piperidino group, a benzothiazolyl group, a benzoxazolyl group and a benzimidazolyl group.

Examples of the oxime represented by formula (III) are illustrated below:

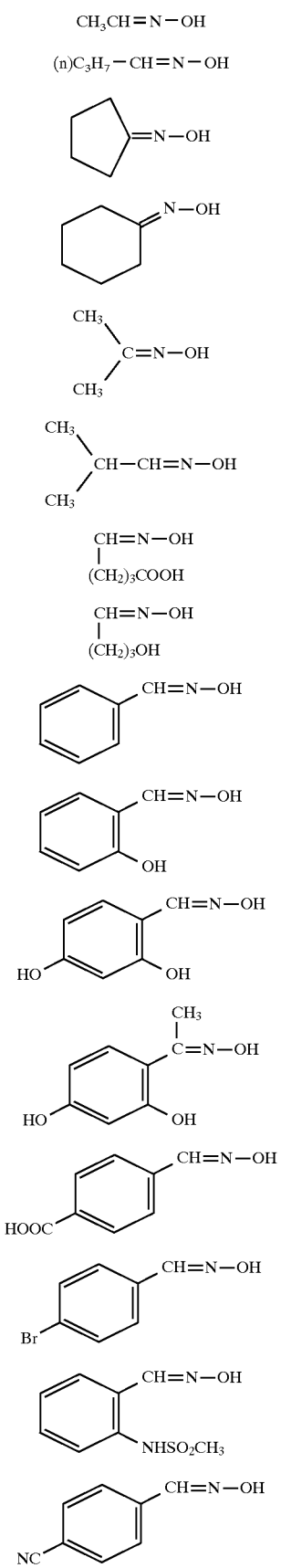
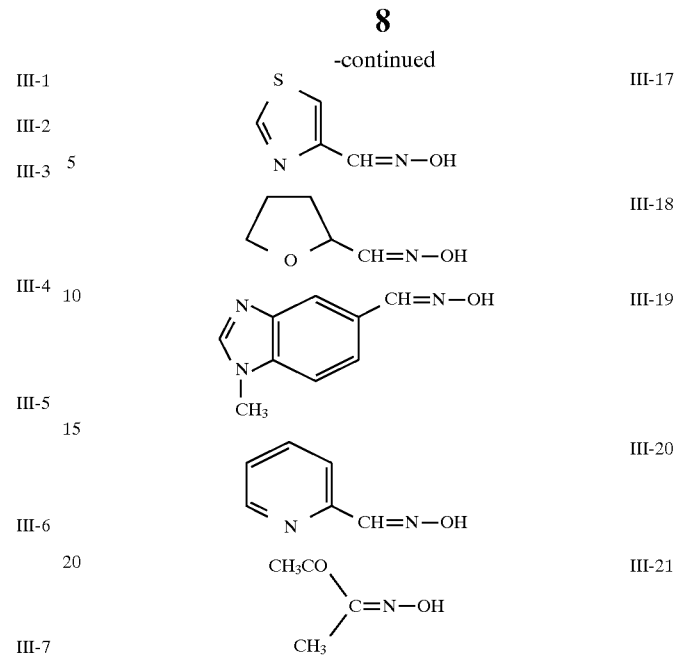

These compounds can be obtained with ease as commercial products or by syntheses according to the methods described in *Organic Functional Group Preparations*, vol. 3, p. 365, edited by S. R. Sandler and W. Karo, published from Academic Press in 1972.

Phenols represented by the following formula (IV) are described below:

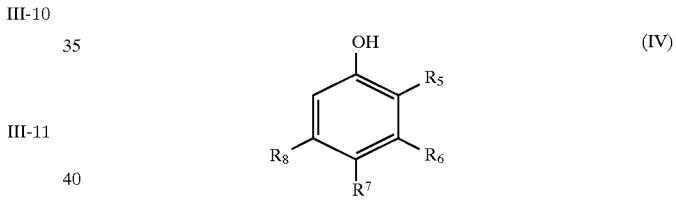

wherein $R_5$, $R_6$, $R_7$ and $R_8$ each independently represents a hydrogen atom, an amino group, a carboxylic acid group, a sulfonic acid group, an alkyl group containing 1 to 4 carbon atoms (which may have a substituent), or an alkoxy group (which may have a substituent). Examples of such a substituent include those exemplified as a substituent which the alkyl or aryl group represented by $R_3$ and $R_4$ in formula (III) may have.

Examples of phenols represented by formula (IV) are illustrated below:

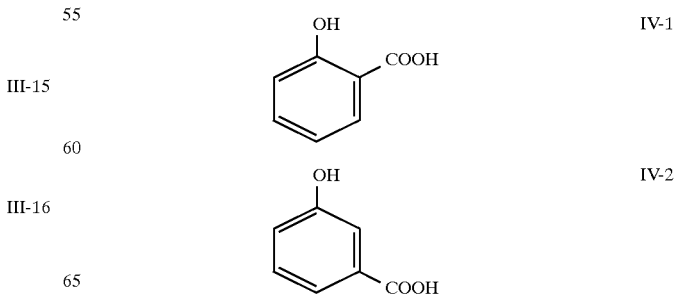

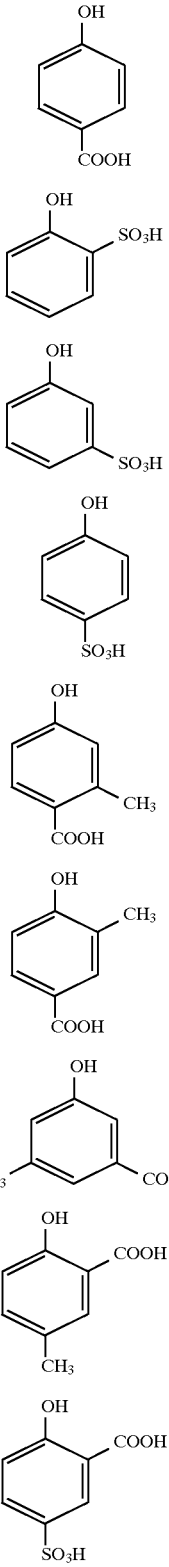

Most of these compounds are commercially available, and the other compounds are also known and can be synthesized with ease.

Fluorinated alcohols represented by formula (V) are described below:

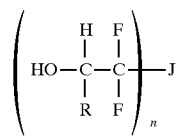

wherein R represents a hydrogen atom, a substituted or unsubstituted alkyl group, a substituted or unsubstituted cycloalkyl group, or a substituted or unsubstituted aryl group; n is 1 or 2; and when n is 1, J represents a hydrogen atom, a fluorine atom, a substituted or unsubstituted alkyl group, a substituted or unsubstituted cycloalkyl group, a substituted or unsubstituted aryl group, a substituted or unsubstituted aralkyl group, or a carboxyl group, and when n is 2, J represents a substituted or unsubstituted alkylene group, a substituted or unsubstituted cycloalkylene group, a substituted or unsubstituted arylene group or a substituted or unsubstituted aralkylene group.

Examples of the substituent include those exemplified with respect to the compound of the foregoing formula (III).

Preferred examples of the compound represented by formula (V) include the compounds where R is a hydrogen atom or a fluorinated alkyl group, n represents 1 or 2, and when n is 1, J represents a hydrogen atom or a fluorinated alkyl group and when n is 2, J represents a fluorinated alkylene group. Among them, those containing 6 carbon atoms or less per one hydrophilic group such as a hydroxy, carboxylic acid or sulfonic acid group, are more preferred because of their sufficient solubilities in processing solutions.

Examples of the compounds represented by formula (V) are illustrated below:

$CF_3CH_2OH$      V-1

$CHF_2CF_2CHFOH$      V-2

V-3

$HOCH_2CF_2CF_2CF_2CH_2OH$      V-4

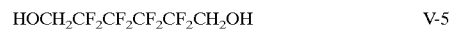

$HOCH_2CF_2CF_2CF_2CF_2CH_2OH$      V-5

V-6

$CHF_2CF_2CF_2CF_2CF_2CH_2OH$      V-7

$CHF_2CF_2CH_2OH$      V-8

Most of these compounds are commercially available, and the other compounds are also known and can be synthesized with ease.

Of the compounds of formulae (I) to (V), the sugars of formula (I) or (II) and the phenols of formula (IV) are preferred. Further, nonreducing sugars (e.g., sucrose) among the sugars and sulfosalicylic acid among the phenols are more preferred.

The compounds of formulae (I) to (V) may be used as a mixture of two or more thereof.

When the above-described compounds used as the development stabilizer in the present invention are acidic, they may be converted into salts by undergoing the reaction with various alkaline compounds prior to the addition to a developer and/or replenisher used in the present invention.

Further, an alkali agent also is incorporated in the developer and replenisher of the present invention.

Examples of the alkali agent which can be incorporated in the developer and replenisher according to the present invention include an inorganic alkali agent and organic alkali agent. Examples of the inorganic alkali agent include sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, ammonium hydroxide, potassium hydroxide, and lithium hydroxide. Examples of the organic alkali agent include monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine, tetramethylammonium hydroxide, tetraethylammonium hydroxide, tetrapropylammonium hydroxide, and tetrabutylammonium hydroxide. These alkali agents can be used as a mixture of two or more thereof.

In both of the developer and replenisher described above, it is desirable that the pH thereof be in the range of 11.0 to 13.5. More desirably, the pH of the developer ranges from 11.5 to 13.2, while that of the replenisher ranges from 12.0 to, 13.5. When the pH value is lower than 11.0, the developability is remarkably deteriorated; while it is higher than 13.5, not only the aluminum surface of a PS plate and the parts of an automatic processor are corroded to a considerable extent but also image dissolution tends to occur.

In the next place, the compounds represented by the foregoing formula (A) or (B) are illustrated below in detail.

$R^1$ to $R^{10}$ each independently represents an alkyl group having 1 to 12, preferably 1 to 8, carbon atoms (e.g., methyl, ethyl, n-propyl, n-butyl), a cycloalkyl group (e.g., cyclohexyl, 3-methylcyclohexyl), a hydroxyalkyl group (e.g., hydroxymnethyl, hydroxyethyl), an unsubstituted or alkyl-substituted benzyl group (e.g., benzyl, isopropylbenzyl), or a substituted or unsubstituted phenyl group (e.g., 2-methoxyphenyl, 3,5-dichlorophenyl).

When $Z_1$, is $N^+$ or $P^+$, $X^1$ represents an anion, and when $Z_1$ is $B^-$, $X^1$ represents a cation. When $Z_2$ is $N^+$ or $P^+$, $X^2$ represents an anion, and when $Z_2$ is $B^-$, $X^2$ represents a cation. When $Z_3$ is $N^+$ or $P^+$, $X^3$ represents an anion, and when $Z_3$ is $B^-$, $X^3$ represents a cation. Examples of the anion include a halogen ion, hydroxide ion, nitric acid ion, sulfuric acid ion, phosphoric acid ion, $PF_5^-$, and $BF_4^-$, and examples of the cation include $Li^+$, $Na^+$, $K^+$, and $NH_4^-$.

It is preferable for the compound represented by formula (A) or (B) that $X^1$ to $X^3$ are halogen ions (e.g., chlorine ion, bromine ion) or hydroxide ions, because it can provide more improved development stability.

n is an integer of 1 to 5, preferably 1 to 3.

Further, when $R^1$ to $R^4$ in formula (A) have 4 to 24 carbon atoms in total, and when $R^5$ to $R^{10}$ in formula (B) have 6 to 48 carbon atoms in total, the corresponding compounds are favorable to the improvement in development stability.

Examples of compounds represented by formula (A) or (B) include:

(1) tetrabutylammonium bromide
(2) tetrabutylammonium chloride
(3) tetrabutylammonium hydroxide
(4) triethylbenzylammonium chloride
(5) triethylbenzylammonium hydroxide
(6) tetramethylammonium chloride
(7) tetramethylammonium bromide
(8) tetramethylammonium hydroxide
(9) tetraethylammonium chloride
(10) tetraethylammonium bromide
(11) tetraethylammonium hydroxide
(12) tetrapropylammonium chloride
(13) tetrapropylammonium bromide
(14) tetrapropylammonium hydroxide
(15) tributylbenzylammonium chloride
(16) tributylbenzylammonium hydroxide
(17) octyldimethylammonium chloride
(18) octyldimethylammonium hydroxide
(19) tetraphenylphosphonium iodide
(20) tetraphenylphosphonium bromide
(21) tetraphenylphosphonium chloride
(22) tetraphenylphosphonium sulfate
(23) tetraphenylphosphonium nitrate
(24) sodium tetraphenylboron
(25) tetra-n-butylphosphonium iodide
(26) tetra-n-butylphosphonium bromide
(27) tetra-n-butylphosphonium chloride
(28) tetra-n-butylphosphonium sulfate
(29) tetra-n-butylphosphonium nitrate
(30) tetrabutylammonium sulfate
(31) tetrabutylammonium nitrate
(32) ethyltriphenylphosphonium bromide
(33) benzyltriphenylphosphonium chloride
(34) tetrabutylphosphonium phosphate
(35) butyltriphenylphosphonium bromide
(36) tetratolylphosphonium bromide
(37) triethylbenzylammonium bromide
(38) triethylbenzylammonium iodide
(39) octyldimethylbenzylammonium chloride
(40) octyldimethylbenzylammonium bromide
(41) lauryldimethylbenzylammonium chloride
(42) lauryldimethylbenzylammonium bromide
(43) 1,2-bis(diphenylphosphino)ethane bromide The compounds represented by formula (A) or (B) are commercially available.

It is desirable that the compound of formula (A) or (B) be used in an amount of at least 0.005 g, preferably at least 0.01 g, per liter of the developer or replenisher, with the general upper limit thereof being 100 g per liter. The stability of the developer and replenisher is heightened with an increase in amount of a quaternary ammonium compound used. Therefore, there is no particular upper limit to the amount of a quaternary ammonium compound added as far as the compound is dissolved in the developer and replenisher. However, the concentration thereof in the developer and replenisher is preferably not higher than 10% by weight.

To the developer and replenisher, various surfactants and organic solvents can optionally be added for the purposes of enhancing the developability, dispersing the developer scum and heightening the ink receptivity in the image area of a PS plate.

Examples of the surfactant which can be used include nonionic surfactants, such as polyoxyethylene alkyl ethers, polyoxyethylene alkyl phenyl ethers, polyoxyethylene polystyryl phenyl ethers, polyoxyethylenepolyoxypropylene alkyl ethers, glycerin fatty acid partial esters, sorbitan fatty acid partial esters, pentaerythritol fatty acid partial esters, propylene glycol monofatty acid esters, cane sugar fatty acid partial esters, polyoxyethylenesorbitan fatty acid partial esters, polyoxyethylenesorbitol fatty acid partial esters, polyethylene glycol fatty acid esters, polyglycerin fatty acid partial esters, polyoxyethylenized castor oils, polyoxyethyleneglycerin fatty acid partial esters, fatty acid diethanolamides, N,N-bis-2-hydroxyalkylamines, polyoxyethylene alkylamines, triethanolamine fatty acid esters, and trialkylamine oxides; anionic surfactants, such as fatty acid salts, abietic acid salts, hydroxyalkanesulfonic acid salts, alkanesulfonic acid salts, dialkylsulfosuccinic acid esters, straight-chain alkylbenzenesulfonic acid salts, branched alkylbenzenesulfonic acid salts, alkylnaphthalenesulfonic acid salts, alkylphenoxypolyoxyethylenepropylsulfonic acid salts, polyoxyethylene alkyl sulfophenyl ethers, N-methyl-N-oleyltaurin sodium salt, N-alkylsulfosuccinic acid monoamide disodium salts, petroleum sulfonic acid salts, sulfated beef-tallow oil, sulfates of fatty acid alkyl esters, alkylsulfuric acid esters, polyoxyethylene alkyl ether sulfuric acid esters, fatty acid monoglyceride sulfuric acid esters, polyoxyethylene alkyl phenyl ether sulfuric acid esters, polyoxyethylene styryl phenyl ether sulfuric acid esters, alkylphosphoric acid esters, polyoxyethylene alkyl ether phosphoric acid esters, polyoxyethylene alkyl phenyl ether phosphoric acid esters, partially saponified styrene/maleic anhydride copolymers, partially saponified olefin/maleic anhydride copolymers, and formaldehyde condensates of naphthalenesulfonates; cationic surfactants such as alkylamine salts, quaternary ammonium salts, polyoxyethylene alkylamine salts, and polyethylene polyamine derivatives; and amphoteric surfactants, such as carboxybetaines, aminocarboxylic acids, sulfobetaines, aminosulfuric acid esters, and imidazolines. The polyoxyethylene moiety present in some of the above-cited surfactants can be replaced by a polyoxypropylene, polyoxybutylene or another polyoxyalkylene moiety, and the resulting surfactants also can be included.

More suitable surfactants are fluorinated surfactants in which a perfluoroalkyl group is present. Examples of such fluorinated surfactants include anionic ones, such as perfluoroalkylcarboxylic acid salts, perfluoroalkylsulfonic acid salts, perfluoroalkylphosphoric acid esters, etc.; amphoteric ones, such as perfluoroalkylbetaines, etc.; cationic ones, such as perfluoroalkyltrimethylammonium salts, etc.; and nonionic ones, such as perfluoroalkylamine oxides, perfluoroalkylethylene oxide adducts, oligomers containing perfluoroalkyl and hydrophilic groups, oligomers containing perfluoroalkyl and lipophilic groups, oligomers containing perfluoroalkyl, hydrophilic and lipophilic groups, and urethanes containing perfluoroalkyl and lipophilic groups.

The surfactant can be used alone or as a mixture of two or more thereof. The concentration of such a surfactant in each of the developer and replenisher at the use is generally from 0.001 to 10% by weight, preferably from 0.01 to 5% by weight.

To the present developer and replenisher, an organic solvent can optionally be added. The organic solvents having a solubility of about 10% or less, particularly 5% or less, are preferred. Examples of such an organic solvent include 1-phenylethanol, 2-phenylethanol, 3-phenyl-1-propanol, 4-phenyl-1-butanol, 4-phenyl-2-butanol, 2-phenyl-1-butanol, 2-phenoxyethanol, 2-benzyloxyethanol, o-methoxybenzyl alcohol, m-methoxybenzyl alcohol, p-methoxybenzyl alcohol, benzyl alcohol, cyclohexanol, 2-methylcyclohexanol, 3-methylcyclohexanol, 4-methylcyclohexanol, N-phenylethanolamine, and N-phenyldiethanolamine. The content of the organic solvent is generally in the range of 0.1 to 5% by weight based on the total weight of the working solution (solution at the use). The amount of an organic solvent used bears a close relationship to the amount of a surfactant used, and so it is desirable to increase the amount of a surfactant used with an increase in amount of an organic solvent used. This is because the use of a large amount of organic solvent and a small amount of surfactant causes incomplete dissolution of the organic solvent to result in failure to ensure satisfactory developability.

Further, the present developer and replenisher can contain an antifoam agent and a water softener, if desired. Examples of a water softener which can be used include polyphosphoric acids and their sodium, potassium and ammonium salts; aminopolycarboxylic acids, such as ethylenediaminetetraacetic acid, diethylenetriaminepentaacetic acid, triethylenetetraminehexaacetic acid, hydroxyethylethylenediaminetriacetic acid, nitrilotriacetic acid, 1,2-diaminocyclohexanetetraacetic acid, 1,3-diamino-2-propanoltetraacetic acid, etc., and their sodium, potassium and ammonium salts; aminotri(methylenephosphonic acid), ethylenediaminetetra(methylenephosphonic acid), diethylenetriaminepenta(methylenephosphonic acid), triethylenetetraminehexa(methylenephosphonic acid), hydroxyethylethylenediaminetri (methylenephosphonic acid) and 1-hydroxyethane-1, 1-diphosphonic acid, and their sodium, potassium and ammonium salts.

The optimum addition amount of the water softener depends on not only the chelation power thereof but also the hardness and amount of hard water used. In general, it is used in a proportion of 0.01 to 5% by weight, preferably 0.01 to 0.5% by weight, based on the amount of the working developer (developer at the actual use). When the proportion is less than 0.01% by weight, there is a possibility that the desired end cannot be sufficiently achieved, while when it is increased beyond 5%, there is a possibility that bad influences upon the image area, e.g., decoloration, is produced.

Although the residual component of the present developer and replenisher is water, various other additives known to those skilled in the art may further be present therein, if desired. As examples of such additives, mention may be made of the neutral salts described in JP-A-58-75152, such as NaCl, KCl and KBr; the complex salts described in JP-A-58-121336, such as $[Co(NH_3)_6]Cl_3$; the group IIa, group IIIa or group IIIb metal-containing ionizable compounds described in JP-A-55-25100; the tetramethyldecinediol described in U.S. Pat. No. 4,374,920; the nonionic surfactants described in JP-A-60-213943; the cationic polymers described in JP-A-55-95946, such as the methylchloride quaternary compound of p-dimethylaminomethylpolystyrene; the amphoteric polyelectrolytes described in JP-A-56-142528, such as the copolymer of vinylbenzyltrimethylammonium chloride and sodium acrylate; the alkali-soluble mercapto compounds and thioether compounds described in JP-A-57-192952; the inorganic lithium compounds described in JP-A-58-59444, such as lithium chloride; the organic lithium compounds described in JP-B-50-34442, such as lithium benzoate; the organometallic surfactants containing Si, Ti or the like described in JP-A-59-75255; the organic boron compounds described in JP-A-59-84241; the quaternary ammonium salts described in European Patent 101010 such as tetraalkylammonium oxide; and the germicides described in JP-A-63-226657, such as sodium dehydroacetate.

To the developer and replenisher used in the present invention, a reducing agent may further be added. The addition of a reducing agent can prevent the printing plate from being covered with scum, and it is especially effective in developing the negative working presensitized plates comprising photosensitive diazonium salt compounds. Suitable examples of such a reducing agent include the sodium, potassium and ammonium salts of inorganic acids, such as sulfurous acid, hydrogen sulfurous acid, phosphorous acid, hydrogen phosphorous acid, dihydrogen phosphorous acid, thiosulfuric acid, dithionic acid, etc. Of these reducing agents, sulfites are particularly superior in scum-preventing effect. The reducing agent can be used in an amount of 0.05 to 5% by weight based on the amount of the working developer.

Furthermore, an organic carboxylic acid can be added to the present developer and replenisher. Favorable organic carboxylic acids are aliphatic carboxylic acids containing 6 to 20 carbon atoms. Examples of an aliphatic carboxylic acid include caproic acid, enanthylic acid, caprylic acid, lauric acid, myristic acid, palmitic acid and stearic acid. In particular, alkanic acids containing 8 to 12 carbon atoms are preferred over the others. Also, the organic carboxylic acid may be an unsaturated fatty acid having a double bond in the carbon chain thereof, or one which has a branched carbon chain. The developer or replenisher used in the present invention has no particular limitation as to the content of an organic carboxylic acid therein. However, if the content thereof is lower than 0.1% by weight, there is a possibility that an organic carboxylic acid cannot produce a sufficient effect. If the content is increased beyond 10% by weight, there is a possibility that the effect cannot be enhanced and, what is worse, a large quantity of carboxylic acid sometimes interferes with the dissolution of another additive used together therewith. Accordingly, it is desirable that the proportion of an organic carboxylic acid be in the range of 0.1 to 10% by weight, preferably 0.5 to 4% by weight, based on the amount of the working developer.

From the viewpoint of conveyance, it is desirable that the present developer and replenisher be prepared in the form of concentrated solution which is reduced in water content, compared with the working solution, and they are diluted with water just before use. As for the concentration degree, the developer and replenisher are properly concentrated to such an extent that ingredients present therein may not separate out nor deposit. On the other hand, the granulation of a silicate developer is described in JP-A-05-134424, JP-A-05-142786 and JP-A-06-59461. Also, such granulation techniques can be applied to the present developer and replenisher. Since the silicate-free developer of the present invention has neither the problem of causing gelation by the lowering of pH nor the problem of being responsible for adhesion of slightly soluble solid matter to an automatic processor, it is more suitable for the present developer to undergo a treatment for solidification, including pulverization and granulation.

The present developer and replenisher are suitably used for not only a PS plate having a positive working photosensitive layer containing an o-quinonediazide compound as a photosensitive agent (which can be converted into a negative working plate by undergoing reversal processing, if desired) but also negative working PS plates having various photocuring photosensitive layers. In particular, the present developer and replenisher have an advantage in that they can ensure a sufficiently high speed in development of a negative working PS plate when the negative working and positive working PS plates are processed in common.

The PS plates for which the present developer and replenisher are suitably employed are described below in detail.

The supports of PS plates to which the present developer and replenisher are applied are sheet materials having high dimensional stability. Examples of such a support include paper, paper laminated with plastics (e.g., polyethylene, polypropylene, polystyrene), and metal sheets (e.g., an aluminum (including aluminum alloys) sheet, a zinc sheet, an iron sheet, a copper sheet). In particular, the present invention can fully achieve its effect when a metal sheet, such as an aluminum sheet, is used as the support of a PS plate. A suitable aluminum sheet is a pure aluminum sheet or an alloy sheet containing aluminum as a main component and a trace amount of foreign atoms, and it may also be an aluminum-laminated or -evaporated plastic film. The thickness of an aluminum sheet is generally from about 0.1 mm to about 0.6 mm.

Prior to a graining treatment, an aluminum sheet is optionally subjected to a degreasing treatment with, e.g., a surfactant, an organic solvent or an alkaline aqueous solution in order to remove a rolling oil from the surface of the aluminum sheet.

In using an aluminum sheet as described above, the sheet surface undergoes a graining treatment. The graining treatment can be effected by adopting a method of mechanically roughening the surface, a method of electrochemically dissolving and roughening the surface, or a method of performing selective dissolution of the surface with a chemical means. As for the method of mechanically roughening the surface, known methods as called a ball abrasion method, a brush abrasion method, a blast abrasion method, a buff abrasion method and so on can be adopted. As for the method of electrochemically roughening the surface, there is a method of soaking an aluminum sheet in a hydrochloric or nitric acid electrolyte and passing therethrough a direct or alternating electric current to render the sheet surface rough. In addition, both the above-cited mechanically and electrochemically roughening methods may be used in combination, as disclosed in JP-A-54-63902.

The thus roughened aluminum sheet undergoes an alkali etching treatment and a neutralizing treatment, if needed, and then it is optionally subjected to anodic oxidation in order to improve the water-holding capacity and abrasion resistance of the sheet surface. As an electrolyte used in the anodic oxidation of an aluminum sheet, any of materials capable of forming a porous oxidized coating can be used. In general, sulfuric acid, phosphoric acid, oxalic acid, chromic acid or a mixture of two or more thereof is used as the electrolyte. The concentration of an electrolyte to be used therein can be properly determined depending on the species thereof.

The treatment conditions of anodic oxidation can be changed variously depending on the electrolyte used, and so they cannot be absolutely specified. In general, however, effective anodic oxidation can be achieved so far as the concentration of an electrolytic solution used is in the range of 1 to 80% by weight, the solution temperature in the range of 5 to 70° C., the electric current density in the range of 5 to 60 A/dm$^2$, the voltage in the range of 1 to 100 V, and the electrolysis time in the range of 10 seconds to 5 minutes.

The coverage of the anodically oxidized coating is preferably at least 1.0 g/m$^2$, and more preferably in the range of 2.0 to 6.0 g/m$^2$. When the anodically oxidized coating has the coverage less than 1.0 g/m$^2$, sufficient press life cannot be secured, and the non-image area of a lithographic plate tends to get scratches to result in adhesion of ink to the scratches upon printing, or generation of the so-called "scratch scum".

Additionally, the anodically oxidation treatment as described above is given to the printing side of the support of a lithographic plate. However, the anodically oxidized coating is generally formed on the back side also at a coverage of 0.01 to 3 g/m$^2$ because the line of electric force goes round to the back side.

After the anodic oxidation treatment, water wettability is given to the aluminum sheet surface, if needed. As a treatment for providing water wettability, there can be adopted a method of using an alkali metal silicate (e.g., sodium silicate solution), as disclosed in U.S. Pat. Nos. 2,714,066, 3,181,461, 3,280,734 and 3,902,734. In that method, the support undergoes a dipping or electrolytic treatment in a sodium silicate solution. In addition, the method of treating the support with potassium fluorozirconate as disclosed in JP-B-36-22063 and the method of treating the support with a polyvinylphosphonic acid as disclosed in U.S. Pat. Nos. 3,276,868, 4,153,461 and 4,689,272 can be adopted.

Before the water wettability-providing treatment as described above, the sealing treatment with hot water or steam may be given to the anodically oxidized coating, as described in Japanese Patent Application No. 2-306415.

Organic Undercoat Layer

Before being coated with a photosensitive layer, the aluminum sheet can be provided with an organic undercoat layer or an interlayer, if desired.

The organic undercoat layer comprises an organic compound selected from among carboxymethyl cellulose, dextrin, gum arabic, amino group-containing phosphonic acids such as 2-aminoethylphosphonic acid, etc., organic phosphonic acids such as unsubstituted and substituted phenylphosphonic acids, naphthylphosphonic acids, alkylphosphonic acids, glycerophosphonic acids, methylenediphosphonic acids, ethylenediphosphonic acids, etc., organic phosphoric acids such as unsubstituted and substituted phenylphosphoric acids, naphthylphosphoric acids, alkylphosphoric acids, glycerophosphoric acids, etc., organic phosphinic acids such as unsubstituted and substituted phenylphosphinic acids, naphthylphosphinic acids, alkylphosphinic acids, glycerophosphinic acids, etc., amino acids such as glycine, β-alanine, etc., hydroxyl group-containing amine hydrochlorides such as triethanolamine hydrochloride, etc., and so on. These compounds may be used as a mixture of two or more thereof.

A coating solution used for forming the foregoing undercoat layer may be adjusted to pH 1 to 12 with a basic substance such as ammonia, triethylamine, potassium hydroxide or the like, and an acidic substance such as hydrochloric acid, phosphoric acid or the like. Further, the coating solution can contain a yellow dye for the purpose of improving on the tone reproducibility of a PS plate.

The coverage of the organic undercoat layer is generally in the range of 2 to 200 mg/m$^2$, preferably 5 to 100 mg/m$^2$, on a dry basis. When the coverage thereof is less than 2 mg/m$^2$, there is a possibility that the organic undercoat layer cannot fully achieve its aim, including the prevention of scum; while when it is increased beyond 200 mg/m$^2$, the impression capacity is liable too be lowered.

An interlayer may be provided for the purpose of improving on the adhesion of the support to a photosensitive layer. In order to achieve this purpose, the interlayer generally comprises a diazo resin, an adsorbent for aluminum, such as, a phosphoric acid compound, and so on.

The interlayer may have any thickness, provided that it can ensure uniform bond-formation when it reacts with a photosensitive layer as the upper layer thereof upon exposure to light. In general, the coverage of the interlayer is in the range of about 1 to about 100 mg/m$^2$, especially 5 to 40 mg/m$^2$, on a dry solids basis.

The content of the diazo resin in the interlayer is generally from 30 to 100% by weight, preferably from 60 to 100% by weight.

Backcoat Layer

Since the present developer and replenisher are relatively high in alkalinity, it is preferable for a PS plate used in the present invention to have a backcoat layer with the intention of preventing the elution of aluminum oxide from the back side of its aluminum support. Examples of such a backcoat layer include those described in detail, e.g., in JP-A-05-45885, JP-A-05-210235 and JP-A-06-35174.

Photosensitive Layer

On the aluminum sheet which has thus acquired a water-wettable surface, a photosensitive layer comprising a known photosensitive composition is provided to prepare a presensitized plate. Examples of a photosensitive composition which can be used include a positive working composition containing a o-quinonediazide compound as the main component and a negative working composition containing a diazonium salt, an alkali-soluble diazonium salt, a photopolymerizable compound mainly comprising a unsaturated double bond-containing monomer, or a cinnamyl or dimethylmaleimido group-containing photocrosslinking compound as the photosensitive component.

Positive Working Photosensitive Layer

As for the o-naphthoquinonediazide compounds used in a positive working photosensitive composition, the 1,2-diazonaphthoquinonesulfonic acid esters of pyrogallol-acetone resins as described in JP-B-43-28403 are preferable. Other appropriate orthoquinonediazide compounds are the 1,2-diazonaphthoquinone-5-sulfonic acid esters of phenol-formaldehyde resins as described in U.S. Pat. Nos. 3,046,120 and 3,188,210, and the 1,2-diazonaphthoquinone-4-sulfonic acid esters of phenol-formaldehyde resins as described in JP-A-02-96163, JP-A-02-96165 and JP-A-02-96761. Further, known o-naphthoquinonediazide compounds are useful as described in e.g., JP-A-47-5303, JP-A-48-63802, JP-A-48-63803, JP-A-48-96575, JP-A-49-38701, JP-A-48-13854, JP-B-37-18015, JP-B-41-11222, JP-B-45-9610, JP-B-49-17481, U.S. Pat. Nos. 2,797,213, 3,454,400, 3,544,323, 3,573,917, 3,674,495 and 3,785,825, GB Patents 1,227,602, 1,251,345, 1,267,005, 1,329,888 and 1,330,932, and German Patent 854,890.

In particular, the compounds obtained by the reaction of 1,2-diazonaphthoquinonesulfonic acid with a polyhydroxy compound having a molecular weight of no higher than 1,000 are preferred over the others. Examples of such compounds include those described, e.g., in JP-A-51-139402, JP-A-58-150948, JP-A-58-203434, JP-A-59-165053, JP-A-60-121445, JP-A-60-134235, JP-A-60-163043, JP-A-61-118744, JP-A-62-10645, JP-A-62-10646, JP-A-62-153950, JP-A-62-178562, JP-A-64-76047, and U.S. Pat. Nos. 3,102,809, 3,126,281, 3,130,047, 3,148,983, 3,184,310, 3,188,210 and 4,639,406.

The amount of the positive working photosensitive compound (including the combination of two or more thereof) is generally from 10 to 50% by weight, preferably from 15 to 40% by weight, based on the amount of the photosensitive composition.

Although an o-quinonediazide compound alone can constitute a photosensitive layer, the combined use of such a compound and an alkaline water-soluble resin as a binder is preferred. Suitable examples of such an alkaline water-soluble resin include novolak resins, such as a phenol-formaldehyde resin, an o-, m- or p-cresol-formaldehyde resin, a m-cresol/p-cresol mixture-formaldehyde resin, and a phenol/cresol (including o-cresol, m-cresol, p-cresol, a m-cresol/p-cresol mixture and an o-cresol/m-cresol mixture) mixture-formaldehyde resin.

Also, a phenol-modified xylene resin, a polyhydroxystyrene, a halogenated polyhydroxystyrene and the phenolic OH group-containing acrylic resin as disclosed in JP-A-51-34711 can be used as a binder.

Examples of other binders which can be used in the present invention include the active imino group-containing polymers described in JP-A-63-226641, the sulfonamido group-containing polymers described in JP-A-02-866, and the copolymers having their molecular weight in the range of $1\times10^4$ to $2.0\times10^5$ and containing as component units various monomers as described in Japanese Patent Application Nos. 5-170484, 5-183022, 5-183023, 6-52112 and 6-123895.

As still other suitable binders, those described in JP-A-06-35184 can be employed.

It is preferable for the above-cited copolymers to comprise unsubstituted carboxylic acids such as acrylic acid, methacrylic acid, maleic anhydride, itaconic acid and the like, and to have their acid values in the range of 0 to 10 meg/g, particularly 0.2 to 5.0 meg/g. The molecular weight of the foregoing copolymer is preferably from $1\times10^4$ to $1.0\times10^5$.

Further, those copolymers may be admixed with a polyvinyl butyral resin, a polyurethane resin, a polyamide resin or an epoxy resin, if desired.

Such an alkali-soluble high molecular compound can be used alone or as a mixture of two or more thereof, and the amount thereof is generally 80% by weight or less based on the total amount of the photosensitive composition.

Further, as described in U.S. Pat. No. 4,123,279, the combined use with the condensates of $C_3$–$C_8$ alkyl-substituted phenols and formaldehyde, such as a t-butylphenol-formaldehyde resin, an octylphenol-formaldehyde resin and the like, is desirable from the standpoint of enhancing the ink-receptivity in the image area.

For the purpose of heightening the sensitivity, it is desirable to add cyclic acid anhydrides, phenols and/or organic acids to the photosensitive composition.

Examples of the cyclic acid anhydride include those described in U.S. Pat. No. 4,115,128.

Examples of the phenol include bisphenol A, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane and 4,4',3",4"-tetrahydroxy-3,5,3',5'-tetramethyltriphenylmethane.

As for the organic acids, various acids described, e.g., in JP-A-60-88942 and JP-A-02-96755 can be used.

It is desirable to use the foregoing cyclic acid anhydrides, phenols and organic acids in a proportion of 0.05 to 15% by weight, more preferably 0.1 to 5% by weight, in the photosensitive composition.

In order to enhance the development stability to variation of developing conditions (the so-called development latitude), the nonionic surfactants as described in JP-A-62-251740 and the amphoteric surfactants as described in JP-A-59-121044 and JP-A-04-13149 can be added to the photosensitive compositions as described above.

The proportion of the foregoing nonionic and amphoteric surfactants in the photosensitive composition is desirably from 0.05 to 15% by weight, and preferably from 0.1 to 5% by weight.

To the aforesaid positive working photosensitive compositions, a print-out agent such as dyes and pigments and an image-coloring agent can be added in order to provide visual images just after exposure.

Typical examples of the print-out agent include the combination of a compound capable of releasing an acid upon exposure (photo-acid generators) and a salt-forming organic dye. More specifically, the combination of an o-naphthoquinone-4-sulfonic acid halide and a salt-forming organic dye as described in JP-A-50-36209 and JP-A-53-8128, and the combination of a trihalomethyl compound and a salt-forming organic dye as described in JP-A-53-36223, JP-A-54-74728, JP-A-60-3626, JP-A-61-143748, JP-A-61-151644 and JP-A-63-58440 can be instanced. The trihalomethyl compounds include the compounds of oxazole type and triazine type, which have high stability to ageing and can provide clear printed-out images.

As for the image-coloring agent, some other dyes in addition to the foregoing salt-forming organic dye can also be employed. Suitable dyes, including the salt-forming organic dyes, are oil-soluble dyes and basic dyes. Examples of such dyes include the dyes described in JP-A-06-35184. In particular, the dyes described in JP-A-62-293247 are preferred.

The positive working photosensitive composition is dissolved in a solvent capable of dissolving all its components, and applied to an aluminum sheet as a support. As examples of a solvent used herein, mention may be made of the organic solvents as described in JP-A-62-251739. These solvents may be used alone or as a mixture of two or more thereof.

The foregoing photosensitive composition is prepared as a solution or dispersion having a solids concentration of 2 to 50% by weight, applied to a support, and then dried.

The coverage of the photosensitive composition (as a photosensitive layer) on a support depends on the intended use thereof. In general, it is desirably in the range of 0.3 to 4.0 g/m$^2$, on a dry weight basis. If the coverage is smaller, the exposure amount required for image formation decreases, but the film strength is also lowered. If the coverage is larger, the photosensitive coating becomes sturdy to provide a printing plate having high impression capacity, but the exposure amount required for image formation increases.

To the aforementioned photosensitive composition, in analogy with the positive working photosensitive compositions described hereinbefore, a surfactant can be added for improving quality of the coated surface. Examples thereof include the fluorine-containing surfactants described in JP-A-62-170950. It is desirable that such a surfactant be added in a amount of 0.001 to 1.0% by weight, more preferably 0.005 to 0.5% by weight, based on the total amount of the photosensitive composition.

Negative Working Photosensitive Layer

Examples of the negative working PS plate to which the present developer and replenisher can be applied effectively include a printing plate which has a photosensitive layer comprising a photosensitive diazo compound, a photopolymerizing photosensitive layer or a photocrosslinking photosensitive layer. Of these plate materials, a photocuring photosensitive PS plate containing a photosensitive diazo compound and a PS plate having a photocrosslinking layer are illustrated in detail below.

Examples of the suitable photosensitive diazo compound include a diazo resin prepared by condensing an aromatic diazonium salt and a reactive carbonyl group-containing organic condensing agent such as aldehydes (e.g., formaldehyde and acetaldehyde) and acetals, in a acidic medium. The most typical diazo resin is a condensate of p-diazophenylamine and formaldehyde. Such a diazo resin can be synthesized according to the methods described, e.g., in U.S. Pat. Nos. 2,679,498, 3,050,502, 3,311,605 and 3,277,074.

Further, the photosensitive diazo compounds described in JP-B-49-48001, JP-A-04-18559, JP-A-04-190361, JP-A-04-172354, JP-A-03-2846, JP-A-03-5754, JP-A-03-240061, JP-A-03-253857, JP-A-04-211253, JP-A-04-219759, JP-A-04-274429 and JP-A-05-5984 can be also employed.

As for the counter anions appropriate to those diazonium salts, those recited, e.g., in JP-B-47-1167, U.S. Pat. Nos. 3,300,309, JP-A-54-98613, JP-A-56-121031, JP-A-58-209733, JP-A-62-175731 and JP-A-63-262643 are examples thereof.

The photosensitive diazo compound to be contained in the photosensitive layer is generally in an amount of 5 to 50% by weight, preferably 8 to 20% by weight.

In combination with the photosensitive diazo compounds described above, lipophilic high molecular compounds which can dissolve or swell in an alkaline water can be preferably used as a binder. As examples of such lipophilic high molecular compounds, mention may be made of copolymers comprising as component units the same monomers as employed in the aforementioned positive working photosensitive compositions and generally having their molecular weights in the range of $1 \times 10^4$ to $2.0 \times 10^5$. Also, the copolymers comprising as component units some of the monomers cited below can be used as high molecular compounds. Examples of such monomers include unsaturated imides, such as maleimide, N-acryloylacrylamide, N-acetylacrylamide, N-propionylacrylamide, N-(p-chlorobenzoyl)acrylamide, N-acetylacrylamide, N-acryloylmethacrylamide, N-acetylmethacrylamide, N-propionylmethacrylamide, N-(p-chlorobenzoyl) methacrylamide, etc.; and unsaturated monomers having a crosslinking group in their side chains, such as N-[2-(acryloyloxy)-ethyl]-2,3-dimethylmaleimide, N-[2-(methacryloyloxy)-ethyl]-2,3-dimethylmaleimide, and vinylcinnamate.

Further, the monomers as cited above may be copolymerized with other copolymerizable monomers. The resulting copolymers may further be modified with glycidylacrylate, glycidylmethacrylate or the like. However, high molecular compounds as a binder should not be construed as being limited to the above-cited copolymers.

It is preferable for the above-cited copolymers to comprise unsubstituted carboxylic acids such as acrylic acid, methacrylic acid, maleic anhydride, itaconic acid and the like, and the acid values of such copolymers are desirably in the range of 0 to 10 meg/g, more preferably 0.2 to 5.0 meg/g.

The molecular weight of the foregoing copolymers is preferably from $1 \times 10^4$ to $1.0 \times 10^5$.

Further, the copolymer may be admixed with a polyvinyl butyral resin, a polyurethane resin, a polyamide resin or an epoxy resin, if desired. Also, novolak resins, phenol-modified xylene resins, polyhydroxystyrenes, halogenated polyhydroxystyrenes and the phenolic OH group-containing alkali-soluble resins disclosed in JP-A-51-34711 can be used as a binder.

The lipophilic high molecular compounds which can dissolve or swell in an alkaline water can be used alone or as a mixture of two or more thereof, and the proportion thereof in the whole photosensitive composition is generally in the range of 40 to 95% by weight on a solid basis.

As for the photocrosslinking polymers used in the photocrosslinking photosensitive layer, polymers having in their main or side chains maleimido, cinnamyl, cinnamoyl, cinnamylidene, cinnamylideneacetyl, chalcone or like groups can be exemplified.

Examples of a polymer having a maleimido group in the side chains include those described in JP-A-52-988 (corresponding to U.S. Pat. No. 4,079,041), German Patent 2,626,769, European Patent Nos. 21,019 and 3,552,Die Angewandte Makromolekulare Chemie, 115 (1983), pages 162–182, and those described in JP-A-49-128991, JP-A-49-128992, JP-A-49-128993, JP-A-50-5376, JP-A-50-5377, JP-A-50-5379, JP-A-50-5378, JP-A-50-5380, JP-A-53-5298, JP-A-53-5299, JP-A-53-5300, JP-A-50-50197, JP-A-51-47940, JP-A-52-13907, JP-A-50-45076, JP-A-52-121700, JP-A-50-10884, JP-A-50-45087, and German Patents 2,349,948 and 2,616,276. These polymers have an average molecular weight of at least 1,000, preferably from $3 \times 10^4$ to $4 \times 10^4$. Further, those polymers have in their side chains at least two maleimido groups per molecule on the average.

In order to render the foregoing polymers, which have maleimido groups in the side chains, soluble or swellable in an alkaline water, acid groups are introduced into those polymers.

Examples of an acid group usable for the aforesaid purpose include a carboxylic acid group, a sulfonic acid group, a phosphoric acid group, a phosphonic acid group, alkali metal and ammonium salts of those groups, and an acid group having a pKa of 6 to 12 when dissociated in an alkaline water, such as —$SO_2NHCO$—, —$CONHCO$—, —$SO_2NHCOO$—, 4-hydroxyphenyl, etc. The polymers suitable for the present invention can be obtained with ease by copolymerizing the monomer having such an acid group and the monomer having a maleimido group generally in the ratio of 10/90 to 50/50, preferably 20/80 to 40/60, by mole. The acid value of such an acid group-containing maleimide polymer is desirably in the range of 30 to 300, more desirably 50 to 200. Suitable examples of an acid group-containing monomer employed in the foregoing copolymerization include carboxyl group-containing vinyl monomers such as acrylic acid, methacrylic acid, etc., maleic acid anhydride, itaconic acid anhydride, and so on.

Among the polymers having an acid value falling within the foregoing range, the copolymers as described in Die Angewandte Makromolekulare Chemie, 128 (1984), pages 71–91 are useful.

In addition, the photosensitive polyesters described in U.S. Pat. No. 3,030,208 can be instanced.

The polymers obtained by modifying those polymers so as to have solubility in an alkaline water can be used, with examples including those described in JP-A-60-191244, JP-A-62-175729, JP-A-62-175730, JP-A-63-25443, JP-A-63-218944 and JP-A-63-218945.

The photocrosslinking polymer preferably has a molecular weight of at least 1,000, preferably from $1 \times 10^4$ to $5.0 \times 10^5$, particularly preferably from $2 \times 10^4$ to $3.0 \times 10^5$.

The amount of the foregoing photocrosslinking polymer is generally from 10 to 99% by weight, preferably from 50 to 99% by weight, based on the total amount of the composition constituting the photosensitive layer.

For the purpose of heightening the adhesion to a support, it is desirable that the photosensitive layer comprising a photocrosslinking polymer contain a photosensitive diazo resin. Examples of such a photosensitive diazo resin include those described above.

The amount of the diazo resin in the photosensitive layer is generally from 0.1 to 30% by weight, preferably from 1 to 10% by weight.

In addition to those diazo resins, the other diazo resins as described in JP-B-47-1167, JP-A-50-118802, JP-B-52-7364 and JP-A-59-222834 may be used in a proportion of not more than 50% by weight based on the amount of the foregoing diazo resin.

In the photosensitive layer employed in the present invention, it is desirable to use, a sensitizing agent, an ink receptivity agent, a plasticizer, a print-out agent, an image coloring agent and so on, as described in JP-A-06-35184. Further, cyclic acid anhydrides, phenols, organic acids and higher alcohols can be added to the photosensitive layer in order to enhance the developability.

The photosensitive composition to be employed in the present invention is dissolved in a solvent capable of dissolving all its components, and applied to an aluminum sheet as a support. Examples of the solvent used herein include the organic solvents as described in JP-A-62-251739. The solvent may be used alone or as a mixture of two or more thereof.

The negative working photosensitive composition is dissolved or dispersed in the solvent in a solid concentration of 2 to 50% by weight, applied to a support, and then dried.

The coverage of the photosensitive composition (as a photosensitive layer) on a support depends on the intended use thereof. In general, it is desirably in the range of 0.3 to 4.0 $g/m^2$, on a dry weight basis. If the coverage is smaller, the exposure amount required for image formation decreases, but the film strength is also lowered. If the coverage is larger, the photosensitive coating becomes sturdy to provide a printing plate having high impression capacity, but the exposure amount required for image formation increases.

To the photosensitive composition, as well as the positive working photosensitive composition described above, a surfactant can be added for improving quality of the coated surface.

In preparing the foregoing presensitized plate, the support may be coated with a backcoat layer on the back side before the photosensitive composition layer on the surface side, or vice versa, or may be coated simultaneously with both layers.

Matte Layer

The surface of the thus provided photosensitive layer is coated with a matte layer with the intention of shortening an evacuation time required for the contact exposure using a vacuum printing flame and preventing the lack of image sharpness from occurring upon printing. To the formation of the matte layer, the method s as described in JP-A-50-125805, JP-B-57-6582, JP-B-61-28986 and JP-B-62-62337 can be applied. Specifically, the matte layer soluble in water and an alkaline developer is well-suited for the PS plates.

Development Processing

The thus obtained PS plates are exposed to active rays through a transparent original by means of a light source such as a carbon arc lamp, a mercury lamp, a metal halide lamp, a xenon lamp, a tungsten lamp, etc., and the n subjected to development processing.

The present developer and replenisher is used to particular advantage in developing PS plates with an automatic processor, and the method of compensating the developer for its activity drop by the use of a replenisher is effectively applied thereto. As for the way of replenishment, known arts are adopted. Suitable examples of known arts include the method described in JP-A-55-115039 wherein the deterioration of developability due to the development and ageing of PS plates is compensated by continuous or intermittent replenishment, the method described in JP-A-58-95349 wherein the elution degree of a photosensitive layer is detected with a sensor in the middle of the developing zone and the replenishment is carried out with a replenisher depending on the lowering of the elution degree, and the methods described in JP-A-01-21451 and JP-A-01-180548 wherein the impedance data of the developer are processed with a computer and the replenishment is carried out depending on the detected deterioration of the developer.

The thus development-processed PS plates are subjected to after-treatments with wash water, a rinse solution containing a surfactant and so on, and a desensitizing solution containing gum arabic, starch derivatives and so on. Also, these treatments may be combined variously.

In order to rationalize and standardize processing operations in the platemaking and graphic arts industry, an automatic processor for PS plates is widely used. Such an automatic processor is, in general, constituted of a developing part and an after-processing part. More specifically, the processor is constructed of an apparatus for conveying PS plates, processing solution tanks and devices for spraying processing solutions, and the processing solutions pumped up are sprayed one after another onto the exposed PS plate from their respective spray nozzles as the plate is being conveyed horizontally. In recent years, on the other hand, it has been known to adopt the processing method in which processing tanks are filled with their respective processing solutions and a PS plate is processed by being conveyed into one tank after another by means of submerged guide rolls or the like and dipped in the processing solutions in succession. In such automatic processing, each processing solution is replenished with each replenisher depending on the processing throughput, the working time and so on.

In addition to the automatic system of processing, the present developer can be used in the so-called throwaway system of processing, wherein the processing is carried out with substantially unused processing solutions. The lithographic plate obtained by having undergone the processing as described above is set in an offset printing machine, and used for printing of a great number of copies.

The present invention will now be illustrated in more detail by reference to the following examples, but the invention should not be construed as being limited to these examples.

EXAMPLE 1

The surface of a 0.30 mm-thick JIS A 1050 aluminum sheet was grained with a nylon brush and an aqueous suspension of 400 mesh pumice, and thoroughly rinsed with water. Then, the sheet was etched by 60-second dipping in a 10% by weight aqueous NaOH kept at 70° C., and washed with running water. Further, the etched sheet was rinsed with a 20% by weight aqueous $HNO_3$ for neutralization, and washed with water. Subsequently thereto, the sheet underwent an electrolytic surface-roughening treatment using sine wave alternating current under a potential ($V_A$) of 12.7 V in a quantity of electricity of 160 Coulomb/$dm^2$ at the anode in a 1% by weight aqueous solution of nitric acid. Its surface roughness measured was 0.6 $\mu$m (expressed in Ra). Furthermore, the sheet was desmutted by being soaked in a 30% by weight aqueous solution of sulfuric acid at 55° C. for 2 minutes. Thereafter, the sheet was subjected to an anodic oxidation treatment using a 20% by weight aqueous solution of $H_2SO_4$ under a current density of 2 A/$dm^2$, thereby forming an anodically oxidized film of 2.7 $g/m^2$. Thus, a substrate was prepared.

The following photosensitive solutions I to IV each was applied to one side of the substrate prepared above so as to have a dry coverage of 2.0 $g/m^2$ to form a photosensitive layer.

| Photosensitive Solution I | |
| --- | --- |
| Esterification product prepared from 1,2-Diazonaphthoquinone-5-sulfonyl chloride and pyrogallol-acetone resin (described in Example 1 of U.S. Pat. No. 3,635,709) | 45 parts by weight |
| Cresol-formaldehyde novolak resin | 110 parts by weight |
| 2-(p-Methoxyphenyl)-4,6-bis(trichloromethyl)-s-triazine | 2 parts by weight |
| Oil Blue #603 (produced by Orient Kagaku Kogyo K.K.) | 1 part by weight |
| Megafac F-177 (fluorine-containing surfactant, produced by Dai-Nippon Ink & Chemicals, Inc.) | 0.4 part by weight |
| Methyl ethyl ketone | 1,000 parts by weight |
| Propylene glycol monomethyl ether | 1,000 parts by weight |

Photosensitive Solution II

A photosensitive solution differing from Photosensitive Solution I in only that "the cresol-formaldehyde novolak resin" used in Photosensitive Solution I was replaced by "a phenol novolak resin".

Photosensitive Solution III

A photosensitive solution differing from Photosensitive Solution I in only that "the cresol-formaldehyde novolak resin" used in Photosensitive Solution I was replaced by "a 9:1 mixture of a phenol novolak resin with the copolymer of p-toluenesulfonylmethacrylimide (28 mole %), acrylonitrile (21 mole %) and ethylacrylate (51 mole %) described in Japanese Patent Application No. 6-52112".

Photosensitive Solution IV

A photosensitive solution differing from Photosensitive Solution I in only that "the esterification product prepared from 1,2-diazonaphpthoquinone-5-sulfonylchloride and a pyrogallol-acetone resin" and "the cresol-formaldehyde novolak resin" used in Photosensitive Solution I were replaced by "the esterification product prepared from 1, 2-naphthoquinonediazide-5-sulfonyl chloride and 2,3,4-trihydroxybenzophenone" and "the copolymer of p-toluenesulfonylmethacrylimide (28 mole %), acrylonitrile (21 mole %) and ethylacrylate (51 mole %), respectively.

On each of the thus-prepared photosensitive layers, a resin solution for forming a matte layer was sprayed in a manner as described below to prepare a PS plate provided with the matte layer.

More specifically, a 12% by weight aqueous solution of partial sodium salt of methylmethacrylate/ethylacrylate/acrylic acid copolymer (obtained by using those monomer in the ratio of 65:20:15 by weight) was prepared as the resin solution for forming a matte layer, and sprayed on the surface of the photosensitive layer by means of a rotated spraying electrostatic coater. The spraying conditions adopted therein were as follows: The sprayer head was rotated at 25,000 r.p.m., the quantity of a resin solution fed was 40 ml/min., the applied potential to the sprayer head was −90 KV, the environmental temperature upon coating was 25° C. and the relative humidity was 50%. 2.5 seconds after the spray coating, the coat surface was dampened by spraying steam thereon. Further, 3 seconds after the dampening, a 60° C. hot air with a humidity of 10% was blown for 5 seconds against the dampened surface, thereby drying the coat.

Each of the PS plates was exposed for 60 seconds through an original film having a step tablet (having 15 steps wherein the optical density difference per step is 0.15) by means of a metal halide lamp of 3 KW placed at a distance of 1 meter.

The effects of the present developers were confirmed by the following method: Each developer to be examined was placed in an amount of 22 liters in the developing tank of a commercially available automatic processor equipped with a dip type of developing tank, Model PS-900NP (made by Fuji Photo Film Co., Ltd.). The development of the exposed PS plates was continued until the total area of the PS plates developed with the automatic processor amounted to 66 m$^2$ (that is, 3 m$^2$/l). The plates developed at the initial stage and the final stage of the processing were examined for the step number of the step tablet where the solid area remained (image remaining area) by developing the step tablet image-exposed plate. The consistency of developability was evaluated by the difference between the two step numbers (reduction in step number).

In analogy with the present developers, the present replenishers were also examined for reduction in step number according to the following procedure: One of the present developers was placed in the automatic processor Model PS-900NP, and then the processing of PS plates was continued for one month in the processing throughput of 50 plates per day as the developer was replenished with a replenisher to be examined. Therein, the initial stage of the processing was defined as the time at which the initial developer was almost (98% or more) replaced with the replenisher.

The following Developers A to H and Replenishers A to H for these developers were prepared.

Additionally, all solutions used for replenishment in the replenisher test were adjusted to pH 13.4, and the development under the condition that each developer placed in the tank was completely replaced by the replenisher thereof as the result of one-month processing in the processing throughput of 50 PS plates per day was carried out under the pH adjusted to that of the developer used. Further, dried deposits remaining on the tank wall of the automatic processor after the developing solution was discharged therefrom at the conclusion of the replenisher test were examined for solubility upon washing with water, and the examination result was adopted as a measure of solution stability.

Developer A

Sucrose (Compound I-18) having the acid dissociation constant of $2.00 \times 10^{-13}$ was used in a concentration of 0.1 mole/l, and admixed with KOH so as to have pH 13.0, thereby preparing Developer A.

(PS plate used: Photosensitive Solution I)

Developer B

Salicylic acid (Compound IV-1) having the acid dissociation constant of $6.31 \times 10^{-14}$ was used in a concentration of 0.1 mole/l, and admixed with KOH so as to have pH 13.0, thereby preparing Developer B.

(PS plate used: Photosensitive Solution I)

Developer C

D-Glucose (Compound I-9) having the acid dissociation constant of $3.47 \times 10^{-13}$ and tetrabutylammonium hydroxide were added such that their concentrations were 0.1 mole/l and $5 \times 10^{-4}$ mole/l, respectively, and KOH was added thereto to adjust the pH to 12.5, thereby preparing Developer C.

(PS plate used: Photosensitive Solution II)

Developer D

Salicylic acid (Compound IV-1) having the acid dissociation constant of $6.31 \times 10^{-14}$ and tetrabutylammonium bromide were added such that their concentrations were 0.1 mole/l and $5 \times 10^{-4}$ mole/l, respectively, and KOH was added thereto to adjust the pH to 12.5, thereby preparing Developer D.

(PS plate used: Photosensitive Solution III)

Developer E

Sulfosalicylic acid (Compound IV-11) having the acid dissociation constant of $1.12 \times 10^{-12}$ and tetrabutylammonium hydroxide were added such that their concentrations were 0.1 mole/l and $5 \times 10^{-4}$ mole/l, respectively, and NaOH was added thereto to adjust the pH to 12.5, thereby preparing Developer (PS plate used: Photosensitive Solution III)

Developer F

Salicylic acid (Compound IV-1) having the acid dissociation constant of $6.31 \times 10^{-14}$ was used in a concentration of 0.1 mole/l, and admixed with KOH so as to have pH 12.0, thereby preparing Developer F.

(PS plate used: Photosensitive Solution IV)

Developer G

Salicylic acid (Compound IV-1) having the acid dissociation constant of $6.31 \times 10^{-14}$, sulfosalicylic acid (Compound IV-11) having the acid dissociation constant of $1.12 \times 10^{-12}$, and tetrabutylammonium hydroxide were added such that their concentrations were 0.05, 0.05, and $5 \times 10^{-4}$ mole/l, respectively. Further, KOH was added thereto so as to provide pH 12.5, thereby preparing Developer G.

(PS plate used: Photosensitive Solution III)

Developer H

Salicylic acid (Compound IV-1) having the acid dissociation constant of $6.31 \times 10^{-14}$ and a fluorinated alcohol (Compound V-8) having the acid dissociation constant of $1.82 \times 10^{-13}$ were added such that their concentrations were 0.05 mole/l and 0.05 mole/l, respectively. Further, KOH was added thereto so as to provide pH 11.5, thereby preparing Developer H.

(PS plate used: Photosensitive Solution IV)

Replenisher A

Sucrose (Compound I-18) having the acid dissociation constant of $2.00 \times 10^{-13}$ was used in a concentration of 0.1 mole/l, and admixed with KOH so as to have pH 13.4, thereby preparing Replenisher A. (The pH upon development was maintained at 13.0 by controlling the replenishment rate so as to balance against the quantity of the alkali consumed.)

(PS plate used: Photosensitive Solution I)

Replenisher B

Salicylic acid (Compound IV-1) having the acid dissociation constant of $6.31 \times 10^{-14}$ was used in a concentration of 0.2 mole/l, and admixed with KOH so as to have pH 13.4, thereby preparing Replenisher B. (The pH upon development was maintained at 13.0 by controlling the replenishment rate so as to balance against the quantity of the alkali consumed.)

(PS plate used: Photosensitive Solution I)

Replenisher C

D-Glucose (Compound I-9) having the acid dissociation constant of $3.47 \times 10^{-13}$ and tetrabutylammonium bromide were added such that their concentrations were 0.2 mole/l and $15 \times 10^{-4}$ mole/l, respectively, and admixed with KOH so as to have pH 13.4, thereby preparing replenisher C. (The pH upon development was maintained at 12.5 by controlling the replenishment rate so as to balance against the quantity of the alkali consumed.)

(PS plate used: Photosensitive Solution II)

Replenisher D

Salicylic acid (Compound IV-1) having the acid dissociation constant of $6.31 \times 10^{-14}$ and tetrabutylammonium hydroxide were used such that their concentrations were 0.2 mole/l and $15 \times 10^{-4}$ mole/l, respectively, and admixed with KOH so as to have pH 13.4, thereby preparing Replenisher D. (The pH upon development was maintained at 12.5 by controlling the replenishment rate so as to balance against the quantity of the alkali consumed.)

(PS plate used: Photosensitive Solution III)

Replenisher E

Sulfosalicylic acid (Compound IV-11) having the acid dissociation constant of $1.12 \times 10^{-12}$ and tetrabutylammonium hydroxide were added such that their concentrations were 0.2 mole/l and $15 \times 10^{-4}$ mole/l, respectively, and admixed with NaOH so as to have pH 13.4, thereby preparing Replenisher E. (The pH upon development was maintained at 12.5 by controlling the replenishment rate so as to balance against the quantity of the alkali consumed.)

(PS plate used: Photosensitive Solution III)

Replenisher F

Salicylic acid (Compound IV-1) having the acid dissociation constant of $6.31 \times 10^{-14}$ was used in a concentration of 0.2 mole/l, and admixed with KOH so as to have pH 13.4, thereby preparing Replenisher F. (The pH upon development was maintained at 12.0 by controlling the replenishment rate so as to balance against the quantity of the alkali consumed.)

(PS plate used: Photosensitive Solution IV)

Developer G

Salicylic acid (Compound IV-1) having the acid dissociation constant of $6.31 \times 10^{-14}$, sulfosalicylic acid (Compound IV-11) having the acid dissociation constant of $1.12 \times 10^{-12}$, and tetrabutylammonium hydroxide were added such that their concentrations were 0.1 mole/l, 0.1 mole/l, and $15 \times 10^{-4}$ mole/l, respectively. Further, KOH was added thereto so as to provide pH 13.4, thereby preparing Replenisher G. (The pH upon development was maintained at 12.5 by controlling the replenishment rate so as to balance against the quantity of the alkali consumed.)

(PS plate used: Photosensitive Solution III)

Replenisher H

Salicylic acid (Compound IV-1) having the acid dissociation constant of $6.31 \times 10^{-14}$ and a fluorinated alcohol (Compound V-8) having the acid dissociation constant of $1.82 \times 10^{-13}$ were added such that their concentrations were 0.1 mole/l and 0.1 mole/l, respectively. Further, KOH was added thereto so as to provide pH 13.4, thereby preparing Replenisher H. (The pH upon development was maintained at 11.5 by controlling the replenishment rate so as to balance against the quantity of the alkali consumed.)

(PS plate used: Photosensitive Solution IV)

Testing results obtained using these developers and replenishers are shown in Table 1.

COMPARATIVE EXAMPLE 1

The same tests as in Example 1 were made using the following conventional developers and replenisher in which the silicate of an alkali metal was present as a development stabilizer.

Comparative Developer (a)

An aqueous potassium silicate solution having the $SiO_2$ concentration of 1.2% by weight and the $SiO_2/K_2O$ ratio of 1.2 by mole was used as Comparative Developer (a). The pH thereof was 13.0. (PS plate used: Photosensitive Solution I)

Comparative Developer (b)

An aqueous potassium silicate solution having the $SiO_2$ concentration of 1.4% by weight and the $SiO_2/K_2O$ ratio of 1.7 by mole was admixed with $5 \times 10^{-4}$ mole/l of tetrabutylammonium hydroxide, thereby preparing Comparative Developer (b). The pH thereof was 12.5. (PS plate used: Photosensitive Solution III)

Comparative Developer (c)

An aqueous potassium silicate solution having the $SiO_2$ concentration of 1.0% by weight and the $SiO_2/K_2O$ ratio of 2.0 by mole was used as Comparative Developer (c). The pH thereof was 12.0. (PS plate used: Photosensitive Solution IV)

Comparative Replenisher

An aqueous potassium silicate solution having the $SiO_2$ concentration of 1.6% by weight and the $SiO_2/K_2O$ ratio of 0.9 by mole was used as Comparative Replenisher for those comparative developers.

Silicate developers having their pH values in the vicinity of 11.5 or lower were subject to gelation, and so they were unsuitable for the processing solution.

The obtained results are shown in Table 1.

TABLE 1

| Developer | pH upon Development | Reduction in Step Number | Solubility of Deposits | Replenisher | pH upon Development | Reduction in Step Number | Solubility of Deposits |
| --- | --- | --- | --- | --- | --- | --- | --- |
| A | 13.0 | 1.3 steps | soluble | A | 13.0 | 1.3 steps | soluble |
| B | 13.0 | 1.3 steps | soluble | B | 13.0 | 1.3 steps | soluble |
| C | 12.5 | 1.5 steps | soluble | C | 12.5 | 1.5 steps | soluble |
| D | 12.5 | 1.5 steps | soluble | D | 12.5 | 1.5 steps | soluble |
| E | 12.5 | 1.5 steps | soluble | E | 12.5 | 1.5 steps | soluble |
| F | 12.0 | 1.8 steps | soluble | F | 12.0 | 1.8 steps | soluble |
| G | 12.5 | 1.5 steps | soluble | G | 12.5 | 1.5 steps | soluble |
| H | 11.5 | 2.0 steps | soluble | H | 11.5 | 2.0 steps | soluble |
| Comparative (a) | 13.0 | 1.5 steps | insoluble | Comparative Replenisher | 13.0 | 1.5 steps | insoluble |
| Comparative (b) | 12.5 | 2.0 steps | insoluble | Comparative Replenisher | 12.5 | 2.0 steps | insoluble |
| Comparative (c) | 12.0 | 2.5 steps | insoluble | Comparative Replenisher | 12.0 | 2.5 steps | insoluble |

As can be seen from Table 1, the processing systems using Developers A to H and Replenisher A to H had less reduction in step number of the step tablet during continuous processing of PS plates than the processing systems using the conventional silicate developers having the same pH values respectively, Comparative Developers (a) to (c), and Comparative Replenisher. Further, the data of Table 1 demonstrate that the developers of the present invention enable a developing system to be designed in a wider pH range and, what is more, the dried deposits arising therefrom are apparently superior in liability to wash (solubility in water) to those arising from the conventional ones.

The species and concentrations of ingredients which can constitute the present developers and replenishers should not be construed as being limited to those used in this example, but any other species and concentrations can be employed as far as they are within the scope of the present invention.

EXAMPLE 2

Negative working PS plates, FNSW, produced by Fuji Photo Film Co., Ltd. were exposed and development-processed in the same manners as in Example 1, except that the exposure was carried out through a negative film and Developer B and Replenisher B were used as the present developer and replenisher respectively, and the reduction in step number in solid image areas due to continuation of the processing was examined by the same method as adopted in Example 1. In analogy with the processing of positive working PS plates, the present developer and replenisher produced good results in the processing of negative working PS plates.

More specifically, the reduction in step number in the processing with Developer B was 1.0 step and the deposits arising from Developer B were soluble in water, and the same results were obtained in the processing with Replenisher B.

EXAMPLE 3

The surface of a 0.30 mm-thick aluminum sheet was grained with a nylon brush and an aqueous suspension of 400 mesh pumice, and thoroughly rinsed with water. Then, the sheet was etched by 60-second dipping in a 10% by weight aqueous NaOH kept at 70° C., and washed with running water. Further, the etched sheet was rinsed with a 20% by weight aqueous $HNO_3$ for neutralization, and washed with water. Subsequently thereto, the sheet underwent an electrolytic surface-roughening treatment using sine wave alternating current under a potential (VA) of 12.7 V in a quantity of electricity of 160 Coulomb/$dM^2$ at the anode in a 1% by weight aqueous solution of nitric acid. Its surface roughness measured was 0.6 μm (expressed in Ra). Furthermore, the sheet was desmutted by being soaked in a 30% by weight aqueous solution of sulfuric acid at 55° C. for 2 minutes. Thereafter, the sheet was subjected to an anodic oxidation treatment using a 20% by weight aqueous solution of $H_2SO_4$ under a current density of 2 A/$dm^2$, thereby forming an anodically oxidized film of 2.7 g/$m^2$. Thus, a substrate was prepared.

Successively, each of the following photosensitive solutions I and II was applied to one side of the thus obtained substrate so as to have a dry coverage of 2.5 g/$m^2$ to form a photosensitive layer.

| Photosensitive Solution I | |
| --- | --- |
| Esterification product prepared from 1,2-Diazonaphthoquinone-5-sulfonyl chloride and pyrogallol-acetone resin (described in Example 1 or U.S. Pat. No. 3,635,709) | 45 parts by weight |
| Cresol-formaldehyde novolak resin | 110 parts by weight |
| 2-(p-Methoxyphenyl)-4,6-bis(trichloromethyl)-s-triazine | 2 parts by weight |
| Oil Blue #603 (produced by Orient Kagaku Kogyo K.K.) | 1 part by weight |
| Megafac F-177 (fluorine-containing surfactant, produced by Dai-Nippon Ink & Chemicals, Inc.) | 0.4 part by weight |
| Methyl ethyl ketone | 1,000 parts by weight |
| Propylene glycol monomethyl ether | 1,000 parts by weight |

Photosensitive Solution II

A photosensitive solution differing from Photosensitive Solution I in only that the cresol-formaldehyde novolak resin used in Photosensitive Solution I was replaced by a phenol novolak resin.

On each of the thus-prepared photosensitive layers, a resin solution for forming a matte layer was sprayed in a manner as described below to prepare a PS plate provided with the matte layer.

More specifically, a 12% by weight aqueous solution of partial sodium salt of methylmethacrylate/ethylacrylate /acrylic acid copolymer (obtained by using those monomer in the ratio of 65:20:15 by weight) was prepared as the resin solution for forming a matte layer, and sprayed on the surface of the photosensitive layer by means of a rotated spraying electrostatic coater. The spraying conditions were as follows: The sprayer head was rotated at 25,000 r.p.m., the quantity of a resin solution fed was 40 ml/min., the applied potential to the sprayer head was −90 KV, the environmental temperature upon coating was 25° C. and the relative humidity was 50%. Two point five seconds after the spray coating, the coat surface was dampened by spraying steam thereon. Further, 3 seconds after the dampening, a 60° C. hot air with a humidity of 10% was blown to the dampened surface for 5 seconds, thereby drying the coat.

Each of the PS plates was exposed for 60 seconds through an original film having a step tablet thereon (having 15 steps wherein the optical density difference per step is 0.15) by means of a metal halide lamp of 3 KW placed at a distance of 1 m.

The effects of the present invention were confirmed by the following method: Each developer to be examined was placed in the amount of 22 liter in the developing tank of a commercially available automatic processor equipped with a dip type of developing tank, Model PS-900NP (made by Fuji Photo Film Co., Ltd.). Separately, a replenisher to be examined was placed in the amount of 5 liter in the undiluted replenisher feeding tank. Under these conditions, the development of the foregoing exposed PS plates was continued for 1 week in the processing quantity of 50 plates per day as the developer was automatically replenished with the replenisher. During this one-week test, the developing tank was free from scum due to foaming and the spray nozzle was not clogged, and so consistent processing was maintained. Thereafter, a prescribed amount of replenisher was fed in excess so that the step number of the solid area (image remaining area) remaining after developing the plate exposed through an original having a step tablet mentioned above might be forcibly changed to the high sensitivity side, and the step number changed by this excessive replenishment was examined for each combination of a developer with a replenisher.

The excess replenishment conditions chosen as the standard for comparison were as follows: The combination of Developer AN and Replenisher GN, which correspond to quaternary ammonium salt-free Developer A and Replenisher G, respectively, (Developer A and the Replenisher G are described below), was used for the development of the PS plate, and the aforesaid prescribed amount concerning the replenisher fed in excess was taken as the amount required for changing the step number of the solid area (image remaining area) by 2.0.

The following Developers A to D and Replenishers E to H for these developers, respectively, were prepared.

Developer A

Sulfosalicylic acid and triethylbenzylammonium hydroxide were mixed such that their concentrations were 0.15 mole/l and 0.2 g/l, respectively, and the resulting solution was adjusted to pH 13.0 with KOH, thereby preparing Developer A.

(PS plate used: Photosensitive Solution I)

Developer B

Sucrose and tetrabutylammonium hydroxide were mixed such that their concentrations were 0.15 mole/l and 0.2 g/l, respectively, and the resulting solution was adjusted to pH 13.0 with KOH, thereby preparing Developer B.

(PS plate used: Photosensitive Solution I)

Developer C

Sulfosalicylic acid and tetrabutylammonium bromide were mixed such that their concentrations were 0.15 mole/l and 0.2 g/l, respectively, and the resulting solution was adjusted to pH 12.5 with KOH, thereby preparing Developer C.

(PS plate used: Photosensitive Solution II)

Developer D

Sodium carbonate and tetrabutylammonium hydroxide were added such that their concentrations were 25.0 g/l and 0.2 g/l, respectively, and the resulting solution was adjusted to pH 12.5 with KOH, thereby preparing Developer D.

(PS plate used: Photosensitive Solution II)

Replenisher E

Sulfosalicylic acid and triethylbenzylammonium hydroxide were mixed such that their concentrations were 0.15 mole/l and 0.8 g/l, respectively, and the resulting solution was adjusted to pH 13.4 with KOH, thereby preparing Replenisher E. (The pH upon developability test was maintained at 13.0).

Replenisher F

Sucrose and tetrabutylammonium hydroxide were mixed such that their concentrations were 0.15 mole/l and 0.8 g/l, respectively, and the resulting solutions were adjusted to pH 13.4 with KOH, thereby preparing Replenisher F. (The pH upon developability test was maintained at 13.0).

Replenisher G

Sulfosalicylic acid and tetrabutylammonium bromide were mixed such that their concentrations were 0.15 mole/l and 0.8 g/l, respectively, and the resulting solution was adjusted to pH 13.4 with KOH, thereby preparing Replenisher E. (The pH upon developability test was maintained at 12.5).

Replenisher H

Sodium carbonate and tetrabutylammonium hydroxide were mixed such that their concentrations were 25.0 g/l and 0.8 g/l, respectively, and the resulting solution was adjusted to pH 13.4 with KOH, thereby preparing Replenisher H. (The pH upon developability test was maintained at 12.5).

EXAMPLE 4

The same tests as in Example 3 were made using combinations of the developers and the replenishers which were prepared in the same manners as Developers A to D and Replenishers E to H, respectively, except that no quaternary ammonium salt was added thereto.

More specifically, the developer corresponding to the quaternary ammonium salt-free Developer A was named Developer AN. The developers corresponding to the quaternary ammonium salt-free Developers B to D were named Developers BN to DN, respectively, and the replenishers corresponding to the quaternary ammonium salt-free Replenishers E to H were named Replenishers EN to HN, respectively.

The testing results obtained in Example 3 and Example 4 are shown in Tables 2 and 3, respectively.

TABLE 2

Example 3

| PS Plate | Developer upper: buffering cpd. lower: quaternary salt | | Replenisher upper: buffering cpd. lower: quaternary salt | | Change in Step Number in Solid Area | Gradation expressed in Step Number |
|---|---|---|---|---|---|---|
| Photosensitive Solution | A | Sulfosalicylic acid $(Et)_3(Ben)N^+OH^-$ | E | Sulfosalicylic acid $(Et)_3(Ben)N^+OH^-$ | 1.3 steps | 6.0 steps |
| | B | Sucrose $(Bu)_4N^+OH^-$ | F | Sucrose $(Bu)_4N^+OH^-$ | 1.0 step | 5.5 steps |
| Photosensitive Solution II | C | Sulfosalicylic acid $(Bu)_4N^+Br^-$ | G | Sulfosalicylic acid $(Bu)_4N^+Br^-$ | 1.5 steps | 5.5 steps |
| | D | Sodium carbonate $(Bu)_4N^+OH^-$ | H | Sodium carbonate $(Bu)_4N^+OH^-$ | 1.5 steps | 6.0 steps |

$(Et)_3(Ben)N^+OH^-$: Triethylbenzylammonium hydroxide
$(Bu)_4N^+OH^-$: Tetrabutylammonium hydroxide
$(Bu)_4N^+Br^-$: Tetrabutylammonium bromide

TABLE 3

Example 4

| PS Plate | Developer upper: buffering cpd. lower: quaternary salt | | Replenisher upper: buffering cpd. lower: quaternary salt | | Change in Step Number in Solid Area | Gradation expressed in Step Number |
|---|---|---|---|---|---|---|
| Photosensitive Solution I | AN | Sulfosalicylic acid | EN | Sulfosalicylic acid | 2.0 steps | 7.0 steps |
| | BN | Sucrose | FN | Sucrose | 2.0 steps | 7.3 steps |
| Photosensitive Solution II | CN | Sulfosalicylic acid | CN | Sulfosalicylic acid | 2.3 steps | 7.3 steps |
| | DN | Sodium carbonate | HN | Sodium carbonate | 2.5 steps | 7.5 steps |

As can be seen from the above tables, the change in number of the steps (corresponding to a change in the sensitivity) was smaller in the combinations of the developers and replenishers in which the quaternary ammonium salts were present than in the combinations of the developers and replenishers in which such salts were absent.

Further, it was demonstrated that the quaternary ammonium salts added to the developers and replenishers had great effect on increasing the contrast of gradation expressed in step number of the step tablet.

The developers and their replenishers prepared in accordance with the present invention can ensure consistent development during continuous development, have excellent storage stability, high processing capacity and low capability to foam, and enable the processing common to negative and positive working presensitized plates. Further, when quaternary ammonium salts are present in the present developers and replenishers, they have great effect on increasing the contrast of gradation expressed in step number of a step tablet (a decrease in the difference between the step number of the image remaining area and that of the non-image area).

While the invention has been described in detail with reference to specific embodiments, it will be apparent to one skilled in the art that various changes and modifications can be made to the invention without departing from its spirit and scope.

What is claimed is:

1. A method of preparing a lithographic printing plate comprising:
   A) providing a presensitized plate comprised of a support and a photosensitive layer;
   B) exposing the presensitized plate to actinic radiation through an original film; and
   C) developing the exposed plate with a developer containing as a development stabilizer at least one sugar in a proportion of at least 0.01 mole/l, said developer having a pH value adjusted to the range of from 11.0 to 13.5 with an alkali agent selected from the group consisting of sodium hydroxide, potassium hydroxide and lithium hydroxide.

2. The method of claim 1 wherein the development stabilizer is a non-reducing sugar.

3. The method of claim 1 wherein a separate replenisher is provided to the developer, said replenisher containing as a development stabilizer at least one sugar in a proportion of at least 0.01 mole/l and having pH value adjusted to the range of from 11.0 to 13.5 with an alkali agent.

4. The method of claim 3 wherein the replenisher has a pH value adjusted to the range of 12.0 to 13.5.

5. The method of claim 3 wherein the replenisher contains a quaternary ammonium salt.

6. The method of claim 1 wherein the developer contains a quaternary ammonium salt.

* * * * *